(12) United States Patent
Huang et al.

(10) Patent No.: US 11,574,882 B2
(45) Date of Patent: *Feb. 7, 2023

(54) PAD STRUCTURE AND MANUFACTURING METHOD THEREOF IN SEMICONDUCTOR DEVICE

(71) Applicant: TAIWAN SEMICONDUCTOR MANUFACTURING COMPANY LTD., Hsinchu (TW)

(72) Inventors: Hung-Shu Huang, Taichung (TW); Ming-Chyi Liu, Hsinchu (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/088,324

(22) Filed: Nov. 3, 2020

(65) Prior Publication Data

US 2021/0050314 A1 Feb. 18, 2021

Related U.S. Application Data

(60) Continuation of application No. 16/689,934, filed on Nov. 20, 2019, now Pat. No. 10,840,198, which is a
(Continued)

(51) Int. Cl.
*H01L 21/56* (2006.01)
*H01L 23/00* (2006.01)
(Continued)

(52) U.S. Cl.
CPC ........ *H01L 24/03* (2013.01); *H01L 21/02274* (2013.01); *H01L 21/56* (2013.01); *H01L 21/768* (2013.01); *H01L 23/3192* (2013.01); *H01L 23/485* (2013.01); *H01L 23/5226* (2013.01); *H01L 24/05* (2013.01);
(Continued)

(58) Field of Classification Search
CPC ... H01L 24/03; H01L 21/02274; H01L 21/56; H01L 21/768; H01L 23/3192; H01L 23/485; H01L 23/5226; H01L 24/05; H01L 29/42344; H01L 29/792; H01L 27/11563; H01L 2224/02331; H01L 21/76805; H01L 21/76831; H01L 23/53295;
(Continued)

(56) References Cited

U.S. PATENT DOCUMENTS 6,590,295 B1 * 7/2003 Liao .................. H01L 24/13
257/781
10,510,696 B2 * 12/2019 Huang .............. H01L 21/02274
(Continued)

*Primary Examiner* — Thanh T Nguyen
(74) *Attorney, Agent, or Firm* — WPAT Law; Anthony King

(57) ABSTRACT

A method of manufacturing a semiconductor device includes: forming a conductive pad region over a substrate; depositing a dielectric layer over the conductive pad region; forming a first passivation layer over the dielectric layer; etching the first passivation layer through the dielectric layer, thereby exposing a first area of the conductive pad region; forming a second passivation layer over the first area of the conductive pad region; and removing portions of the second passivation layer to expose a second area of the conductive pad region.

20 Claims, 10 Drawing Sheets

Related U.S. Application Data division of application No. 15/962,440, filed on Apr. 25, 2018, now Pat. No. 10,510,696.

(60) Provisional application No. 62/592,091, filed on Nov. 29, 2017.

(51) Int. Cl.

| | |
|---|---|
| *H01L 23/522* | (2006.01) |
| *H01L 21/02* | (2006.01) |
| *H01L 29/423* | (2006.01) |
| *H01L 29/792* | (2006.01) |
| *H01L 23/31* | (2006.01) |
| *H01L 23/485* | (2006.01) |
| *H01L 21/768* | (2006.01) |
| *H01L 27/11563* | (2017.01) |

(52) U.S. Cl.
CPC ...... *H01L 29/42344* (2013.01); *H01L 29/792* (2013.01); *H01L 27/11563* (2013.01); *H01L 2224/02331* (2013.01)

(58) Field of Classification Search
CPC ..... H01L 2224/05572; H01L 27/11568; H01L 2224/05; H01L 2224/0556
See application file for complete search history.

(56) References Cited

U.S. PATENT DOCUMENTS

| | | | |
|---|---|---|---|
| 2011/0209899 A1* | 9/2011 | Hill | H01L 24/13 174/126.1 |
| 2011/0304042 A1* | 12/2011 | Lin | H01L 24/13 257/737 |
| 2013/0147031 A1* | 6/2013 | Chen | H01L 24/11 257/737 |

\* cited by examiner

PAD STRUCTURE AND MANUFACTURING METHOD THEREOF IN SEMICONDUCTOR DEVICE

PRIORITY CLAIM AND CROSS-REFERENCE

This application claims priority to U.S. provisional application Ser. No. 62/592,091 filed Nov. 29, 2017, and is a Continuation of U.S. non-provisional application Ser. No. 16/689,934 filed Nov. 20, 2019, which is a Divisional application claiming priority to U.S. non-provisional application Ser. No. 15/962,440 filed Apr. 25, 2018, the disclosures of which are hereby incorporated by reference in its entirety.

BACKGROUND

In modern semiconductor devices and systems, integration and miniaturization of components have progressed at an increasingly rapid pace. One of the growing challenges is the formation of memory devices. As the memory device is manufactured with greater density and smaller footprint in advanced technology nodes, more manufacturing steps are introduced to meet the geometrical and performance requirements. However, the production steps and cost are inevitably increased. Thus, it is desirable to enhance the existing manufacturing process in a more efficient manner.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
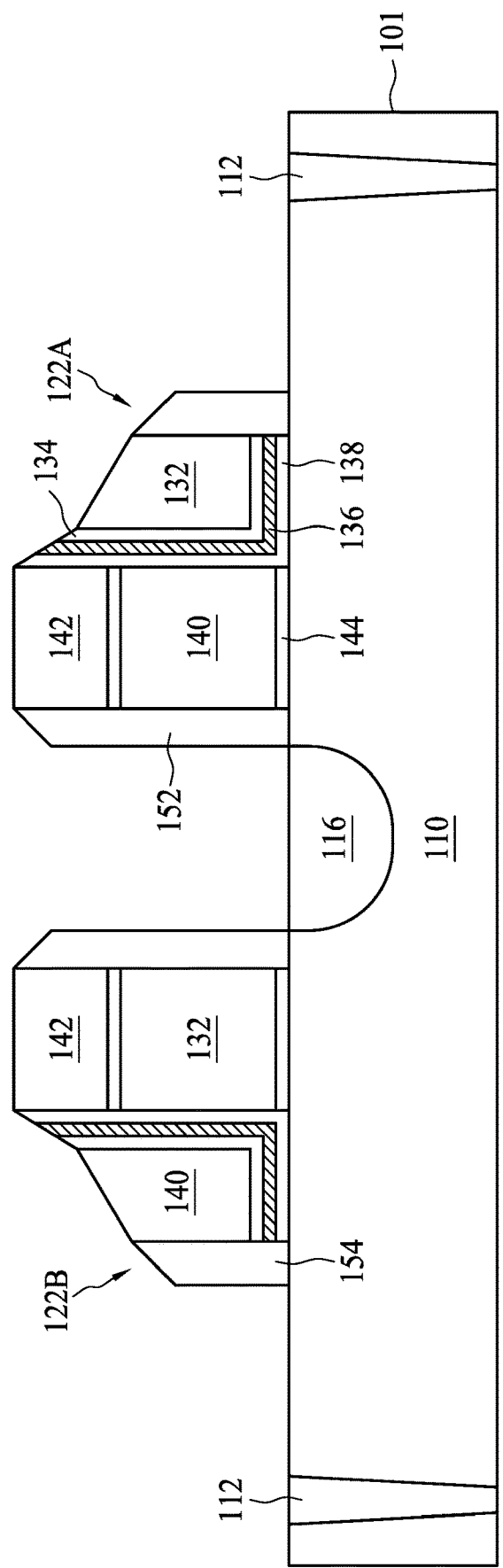
FIG. 1 to FIG. 3 are cross-sectional views of intermediate structures for a method of manufacturing a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substantially" refers to the complete or nearly complete extent or degree of an action, characteristic, property, state, structure, item, or result. For example, a surface being described as "substantially" coplanar with another surface would mean that these two surfaces are either completely located in the same plane or nearly completely located in the same plane. The exact allowable degree of deviation from absolute completeness may in some cases depend on the specific context. In some examples, the allowable degree of deviation is less than about 0.1%. In some examples, the allowable degree of deviation is less than about 1% or less than about 5%. In some examples, the allowable degree of deviation is less than about 10%. Generally, however, the nearness of completion will be regarded as equivalent to absolute and total completion.

As memory devices are manufactured, the order of manufacturing operations should be carefully arranged in order to reduce cost while maintaining device quality and performance. In a typical process of manufacturing non-volatile memory devices including an array of memory cells, a pad structure may be formed over the array of memory cells for electrically coupling the memory cells with external conductive features. However, inventors have discovered that some treatments, such as a thermal operation, that are performed during or subsequent to the formation of the pad structure, may adversely impact the underlying memory cells. For example, undesired hydrogen atoms or water molecules introduced by the thermal process may penetrate through some unfinished features of the pad structure and arrive at the underlying memory cell. The performance of the memory cell under such conditions will be diminished due to the contamination.

In order to resolve the above issue, a method of fabricating the pad structure is proposed in the present disclosure. A passivation region is employed in the pad structure such that the memory cells underlying the pad structure can be protected from contamination of the hydrogen atoms or water molecules. In addition, the proposed method provides the processing advantage by performing one fewer lithographic operation during forming of the passivation region as compared to similar approaches. Thus, the manufacturing time and cost can be further decreased.

Figure 2:
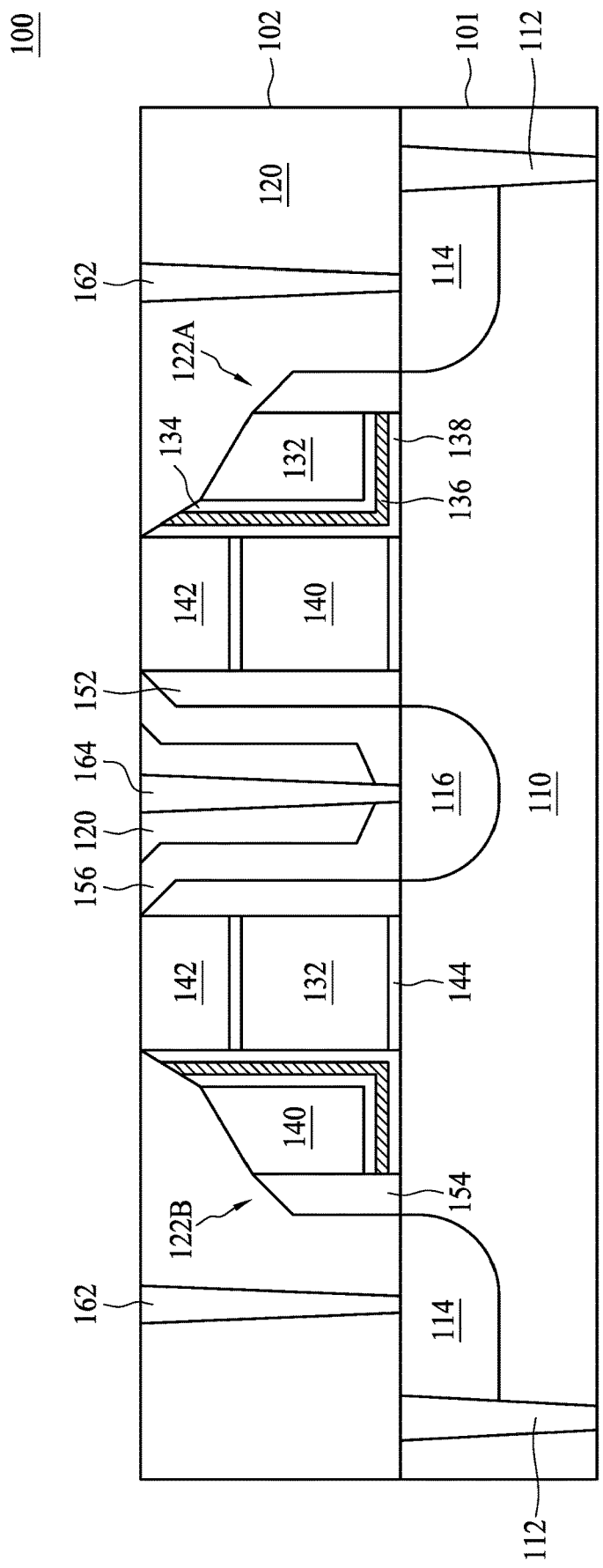
Figure 3:
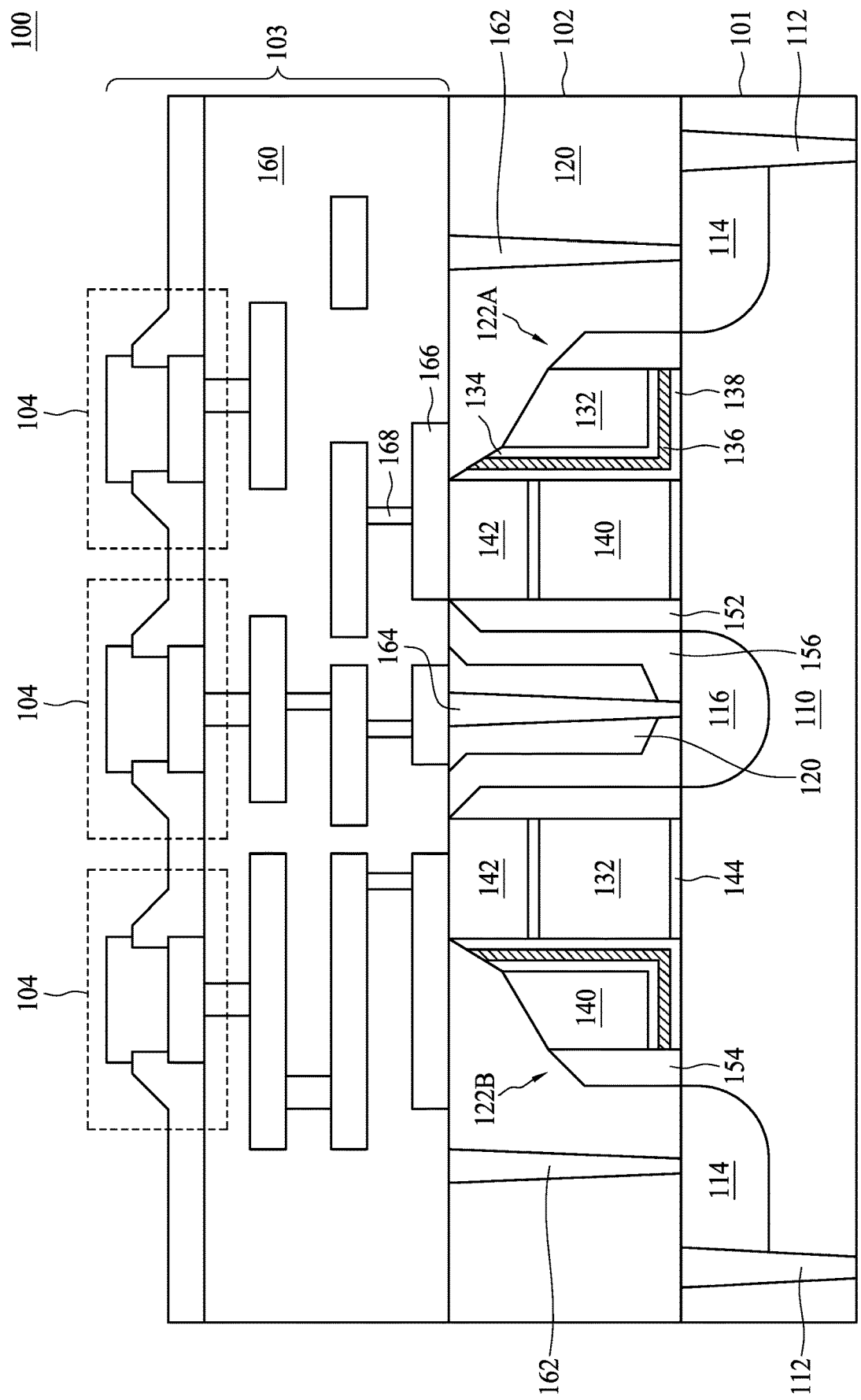

FIG. 1 to FIG. 3 are cross-sectional views of intermediate structures for a method of manufacturing a semiconductor device 100, in accordance with some embodiments. The semiconductor device 100 may be a memory device. In the depicted example, the semiconductor device 100 is a non-volatile memory device, such as a MONOS (Metal-Oxide-Nitride-Oxide-Silicon) flash memory. Referring to FIG. 1, a substrate 101 is received or provided. The substrate 101 includes a semiconductor material, such as silicon. In one embodiment, the substrate 101 may include other semiconductor materials, such as silicon germanium, silicon carbide, gallium arsenide, or the like. The substrate 101 may be a p-type semiconductive substrate (acceptor type) or an n-type semiconductive substrate (donor type). Alternatively, in various applications the substrate 101 may include another elementary semiconductor, such as germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In another embodiment, the substrate 101 may be a semiconductor-on-insulator (SOI). In still other embodiments, the substrate 101 may include a doped epitaxial layer, a gradient semiconductor layer, or a semiconductor layer overlaying another semiconductor layer of a different type, such as a silicon layer on a silicon germanium layer.

Next, isolation structures 112 are formed in the substrate 101. The isolation structures 112 are shallow trench isolation (STI) in the depicted embodiment, although other isolation structures, such as local oxidation of silicon (LOCOS), are also possible. The isolation structures 112 may be formed of electrically insulating materials, such as dielectric materials. In some embodiments, the isolation structures 112 are formed of an oxide (e.g., silicon oxide or Ge oxide), a nitride (e.g., silicon nitride), an oxynitride (e.g., GaP oxynitride), silicon dioxide ($SiO_2$), silicon oxynitride ($Si_xO_yN_z$), a polymer material, or the like. The dielectric material may be formed using a suitable process such as atomic layer deposition (ALD), chemical vapor deposition (CVD), physical vapor deposition (PVD), thermal oxidation, UV-ozone oxidation, or combinations thereof. In some embodiments, a planarization operation, such as grinding or chemical mechanical planarization (CMP) processes, may be used to remove excess materials of the isolation structure 112 and level the top surfaces of the isolation structures 112 with the substrate 101.

Next, memory cells 122 are formed on the substrate 101. The memory cells 122 may be arranged in an array on the substrate 101. As illustrated in FIG. 1, two memory cells 122A and 122B are laterally spaced apart from each other as an example. The memory cells 122A and 122B may share one or more features, such as a drain region, which is described in detail in subsequent paragraphs. Each of the memory cells 122 includes a control gate 132, a barrier layer 134, a charge trapping layer 136, a tunneling layer 138, a select gate 140, a mask layer 142, and a select gate dielectric layer 144.

The tunneling layer 138, the charge trapping layer 136 and the barrier layer 134 are sequentially formed as a stack over the substrate 101. In the present embodiment, the stack of the tunneling layer 138, charge trapping layer 136 and barrier layer 134, which are commonly known as a composite ONO layer, are disposed between the substrate 101 and the control gate 132. Further, the composite ONO layer extends upward and covers a sidewall of the control gate 132. The composite ONO layer extends between the control gate 132 and the select gate 140. The charge trapping layer 136 is electrically insulated by the tunneling layer 138 and the barrier layer 134 on respective two sides. Further, the charge trapping layer 136 contains trapping sites for retaining information-bearing charges by appropriately biasing the control gate 132 and the select gate 140. In some embodiments, the barrier layer 134 may include dielectric materials, such as silicon dioxide or other suitable materials. In some embodiments, the tunneling layer 138 may include dielectric materials, such as silicon dioxide or other suitable materials. In some embodiments, the charge trapping layer 136 may include silicon nitride or other suitable materials. Each of the tunneling layer 138, the charge trapping layer 136 and the barrier layer 134 may be formed using CVD, PVD, ALD or other suitable operations.

The control gate 132 is formed over the barrier layer 134. The control gate 130 is configured to receive a biasing voltage to move or sense charges during a programming (such as write or erase) operation or read operation of the memory cell 122. For example, in a programming operation the control gate 132 is biased to drive information-bearing charges into or away from the charge trapping layer 136 through the tunneling layer 138. The control gate 132 is formed of a conductive material, such as polysilicon or metallic materials (e.g., tungsten silicide). The control gate 132 may be formed by depositing a blanket layer and patterning the blanket layer. In the embodiment in which silicide is selected, a silicidation operation is performed to react silicon with metal materials, thereby forming a silicide-type control gate 132.

The select gate dielectric layer 144 is formed over the semiconductor substrate 101 adjacent to the tunneling layer 138. The select gate dielectric layer 144 may include silicon dioxide or other suitable gate dielectric materials. The select gate 140 is formed over the select gate dielectric layer 144. The select gate 140 is formed of a conductive material such as polysilicon or doped polysilicon. The select gate 140 may be formed by depositing a blanket layer and patterning the blanket layer, thereby leaving the region of the select gate 140. The select gate 140 may receive a biasing voltage and cooperate with the control gate 132 to facilitate the programming operation of the memory cells 122.

The mask layer 142 is formed over the select gate 140. The mask layer 142 is formed of dielectric materials, such as silicon nitride. Alternatively, the mask layer 142 may also include tetraethyl orthosilicate (TEOS). In some embodiments, a sidewall of the mask layer 142 is covered by the tunneling layer 138. In some embodiments, the mask layer 142 has an upper surface higher than the tunneling layer 138, the charge trapping layer 136, the barrier layer 134, and the control gate 132.

Select gate spacers 152 are formed on the substrate 101 and cover a sidewall of a respective select gate 140. Two adjacent memory cells 122A and 122B may have respective select gate spacers 152 facing each other. The select gate spacer 152 is formed of dielectric materials, such as nitride, oxide, or other suitable materials. In addition, a control gate spacer 154 is formed on the substrate 101 and covers an outer sidewall of the respective control gate 132. In the present embodiment, the control gate spacer 154 also covers a sidewall of the composite ONO layer. The control gate spacer 154 is formed of dielectric materials, such as oxide, nitride, or other suitable materials. In some embodiments, the control gate spacer 154 and the select gate spacer 152 may include different materials. In some embodiments, the control gate 132 has an inclined upper surface inclining from a side of the mask layer 142 toward a side of the control gate spacer 154.

Referring to FIG. 2, two source regions 114 and a drain region 116 are formed in the substrate 101. The source regions 114 and the drain region 116 may be formed by one or more ion implantation operations. In some embodiments, the source regions 114 and the drain region 116 are of a dopant type opposite to that of the substrate 101, for example, an N-type or P-type dopant. Each of the source regions 114 is formed between the corresponding control gate spacers 154 and a respective isolation structure 112, and the drain region 116 is formed between the two adjacent select gates 140. Each of the source regions 114 is associated with the individual memory cells 122A and 122B, while the drain region 116 is shared by both the memory cells 122A and 122B. In some embodiments, an etch stop layer 156 is formed over the drain region 116 or other features.

Subsequently, an inter-layer dielectric (ILD) 120 is formed over the substrate 101 and the memory cells 122. The ILD 120 may be formed of oxides, such as un-doped silicate glass (USG), fluorinated silicate glass (FSG), low-k dielectric materials, or the like. The low-k dielectric materials may have dielectric constants (i.e., k values) lower than 3.8, although the dielectric materials of the ILD 120 may be close to 3.8. In some embodiments, the k values of the low-k dielectric materials are lower than about 3.0, and may be lower than about 2.5. The ILD 120 may be formed by initially forming a blanket dielectric material through a suitable process, such as CVD, PVD, ALD, spin-on coating, or the like. In some embodiments, a planarization operation, such as grinding or chemical mechanical polishing (CMP) is employed to remove excess dielectric materials and level the ILD 120 with the upper surface of the mask layer 142.

Next, a photoresist (not separately shown) is formed over the ILD layer 120. Patterning operations, such as lithographic and etching methods, are performed on the photoresist layer to form vias through the ILD 120. The vias may extend downward to expose the underlying features such as the source regions 114, the drain region 116, and the conductive features of the memory cell 122 (e.g., the control gate 132 and the select gate 140). Conductive materials may be filled in the vias to form conductive vias. For example, two conductive vias 162 are formed to electrically couple to the source regions 114 and a conductive via 164 is formed to electrically couple to the drain region 116. The conductive vias (e.g., vias 162 and 164) may be formed of metallic materials, such as tungsten, titanium nitride, tantalum, or the like. A memory layer 102, that is comprised of at least the array of memory cells 122, the ILD 120 and conductive vias, is formed accordingly. Although not shown, additional conductive vias may be formed to electrically couple to the control gate and the select gate of each of the memory cells 122 using a similar forming method. In some embodiments, a silicide layer may be formed between the conductive vias and the conductive features (such as the source regions 114 or the drain region 116) in order to reduce contact resistance, although this is not separately shown.

FIG. 3 illustrates the formation of a redistribution layer (RDL) 103 over the memory layer 102. The RDL 103 is configured to provide rerouted interconnections between its overlying components. In addition, the RDL 103 is configured to electrically couple its overlying components with the features of the memory layer 102 or the substrate 101. The RDL 103 may include a stacked conductive structure comprised of multiple metal layers. Each of the metal layers may include conductive wires or lines and is electrically coupled to an adjacent overlaying or underlying metal layer through metal vias. For example, several spaced metal lines 166 in different metal layers are interconnected through connecting metal vias 168. Moreover, the metal lines 166 and metal vias 168 are electrically insulated by insulating materials, such as an inter-metal dielectric (IMD) 160. The IMD 160 may be formed of oxides, such as un-doped silicate glass (USG), fluorinated silicate glass (FSG), low-k dielectric materials, or other dielectric materials. In accordance with some embodiments, the IMD 160 comprises a polymer material. The IMD 160 may be formed by CVD, PVD, ALD, spin-on coating, or other suitable operations. The configuration and number of metal layers of the RDL 103 shown in FIG. 3 are for illustration only. Other numbers and configurations of the RDL 103 are still within the contemplated scope of the present disclosure.

Still referring to FIG. 3, several pad structures 104 are formed in a topmost layer of the RDL 103. The pad structure 104 is formed for electrically coupling the semiconductor device 100 with external features or devices. In some embodiments, the pad structure 104 is electrically coupled to at least one of the memory cells 122 through the metal lines 166 and metal vias 168 in the intermediate layers of the RDL 103. The components and manufacturing steps of the pad structures 104 are described in greater detail in subsequent paragraphs.

The inventors have discovered hydrogen atoms or steam (water molecules) left in the memory cells 122, i.e., the composite ONO layer. Specifically, such residual hydrogen or steam may contaminate the composite ONO layer, i.e., the barrier layer 134, the charge trapping layer 136 and the tunneling layer 138, by interacting with stored charges around the ONO layer and absorbing these charges. Since the amount of the stored charges is closely related to the data accuracy of the respective memory cell, the data integrity of the memory cells 122 can be significantly diminished. The inventors further found that the hydrogen atoms or steam may originate from a thermal or cleaning operation in forming the pad structures 104, penetrate into and travel through some features, such as dielectric materials, of the RDL 103 and the memory layer 102, and arrive at the ONO layer. Therefore, it is necessary to improve existing procedures of manufacturing the pad structure 104 in order to prevent hydrogen and/or water contamination.

Figure 4:
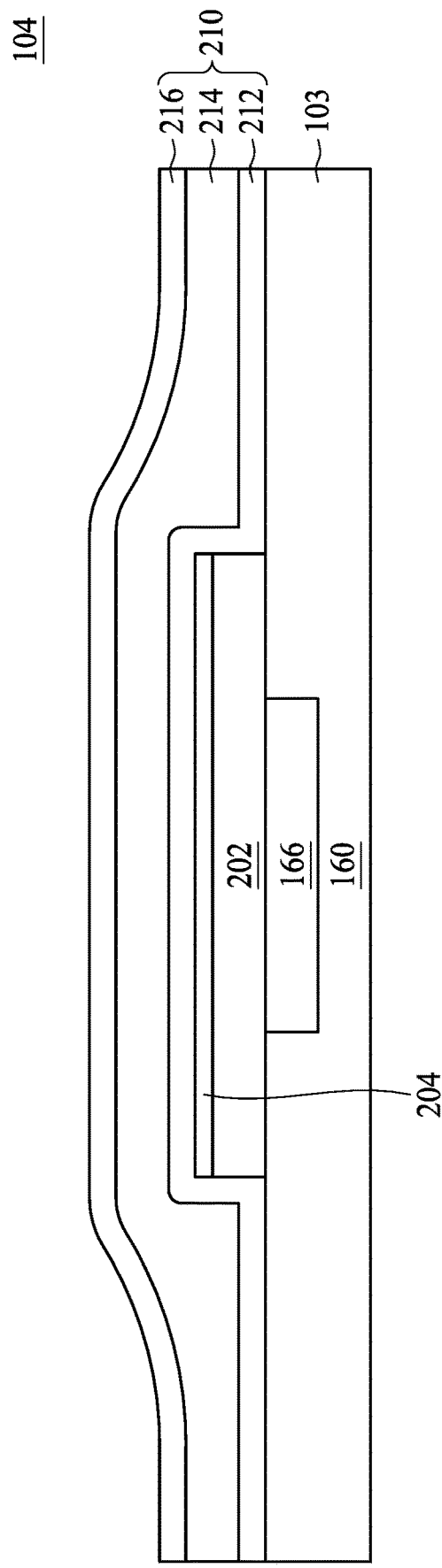
FIG. 4 to FIG. 10 are cross-sectional views of intermediate structures for a method of manufacturing a pad structure of the semiconductor device in FIG. 3, in accordance with some embodiments.

FIG. 4 to FIG. 10 are cross-sectional views of intermediate structures for a method of manufacturing a pad structure 104 of the semiconductor device in FIG. 3, in accordance with some embodiments. The method continues with the formation of the RDL 103 described and illustrated with reference to FIG. 3, in which the intermediate metal layers of the RDL 103 are illustrated. Referring to FIG. 4, the formation of a topmost layer of the RDL 103 begins with forming the pad structure 104. First, a conductive pad region 202 is formed over a metal line 166 or a metal via 168 of the RDL 103. The conductive pad region 202 is formed of a conductive material, such as aluminum, copper, tungsten, an alloy thereof, combinations thereof, or the like. The conductive pad region 202 may be formed by initially blanket depositing a conductive material over the IMD 160 of the RDL 103 and patterning the conductive material into isolated conductive pad regions 202 on the IMD 160 (shown in FIG. 3). In some embodiments, the conductive pad region 202 has a width between about 30 μm and about 200 μm, for example about 60 μm. In some embodiments, the conductive pad region 202 has a thickness between about 1,300 nm and about 1,500 nm, for example 1,400 nm. The conductive pad region 202 may have a circular shape, a polygonal shape or a strip shape when viewed from above.

Subsequently, a protection region 204 is formed over the conductive pad region 202. The protection region 204 may cover the conductive pad region 202. In the depicted example, the protection region 204 has sidewalls aligned with sidewalls of the conductive pad region 202 from a cross-sectional view. The protection region 204 has a greater hardness than the conductive pad region 202, and may be formed of titanium nitride or other suitable materials. As an exemplary manufacturing method, the protection region 204 may be formed by initially blanket depositing a protection material covering the IMD 160 and the conductive pad region 202, and patterning the blanket material to remove excess portions outside of sidewalls of the conductive pad region 202. In some embodiments, the conductive pad region 202 is patterned along with the patterning operation of the protection region 204 by sharing a same lithographic mask of the protection region 204. In some embodiments, the protection region 204 may have a thickness between about 500 Angstrom and about 1,500 Angstrom, for example 700 Angstrom.

Next, a composite dielectric layer 210 is formed over the conductive pad region 202 and the protection region 204. In some embodiments, the composite dielectric layer 210 includes a layered structure. In the depicted embodiment, a first oxide layer 212 is conformally formed over the protection region 204 and the IMD 160. The first oxide layer 212 may be formed using low-pressure CVD (LPCVD), plasma-enhanced CVD (PECVD), PVD, ALD, or other suitable processes. In some embodiments, the first oxide layer 212 has a thickness between about 100 nm and about 500 nm, for example 200 nm. A second oxide layer 214 is formed to cover the first oxide layer 212. In some embodiments, the second oxide layer 214 comprises a high-density plasma (HDP) oxide that is formed using an HDP-CVD process. The second oxide layer 214 using HDP-CVD may have a better gap fill performance and provide a smoother surface than the surface of the first oxide layer 212. In some embodiments, the second oxide layer 214 has a thickness between about 600 nm and about 1,200 nm, for example 900 nm. A third oxide layer 216 is subsequently formed over the second oxide layer 214. In some embodiments, the third oxide layer 216 is formed using LPCVD, PECVD, PVD, ALD, or other suitable processes. In some embodiments, the third oxide layer 216 and the first oxide layer 212 are formed of a same material. In some embodiments, the third oxide layer 216 has a thickness between about 500 nm and about 1,000 nm, for example 800 nm.

Figure 5:
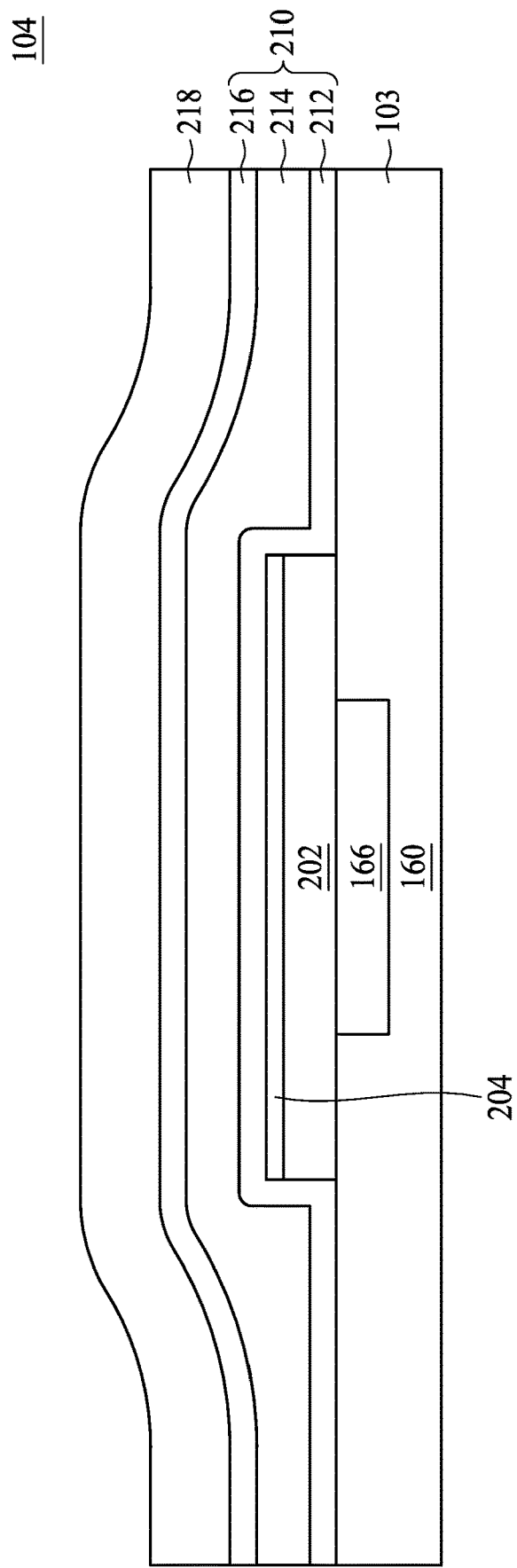

The method continues with a forming of a first passivation layer 218, as illustrated in FIG. 5. The first passivation layer 218 is formed in a blanket-like layer over the composite layer structure 210. In some embodiments, the first passivation layer 218 is formed of a dielectric material, such as a silicon nitride, silicon oxynitride, silicon dioxide or titanium dioxide. In some embodiments, the first passivation layer 218 is formed of a dielectric material different from that of the composite dielectric layer 210. For example, in the current example, the first passivation layer 218 is formed of silicon nitride in order to provide better protection capability against hydrogen and water than that of silicon oxide. In some embodiments, the first passivation layer 218 has a thickness between about 0.4 µm and about 0.8 µm, for example 0.6 µm. In some embodiments, the first passivation layer 218 is formed using CVD, PVD, ALD, or other suitable processes.

Figure 6:
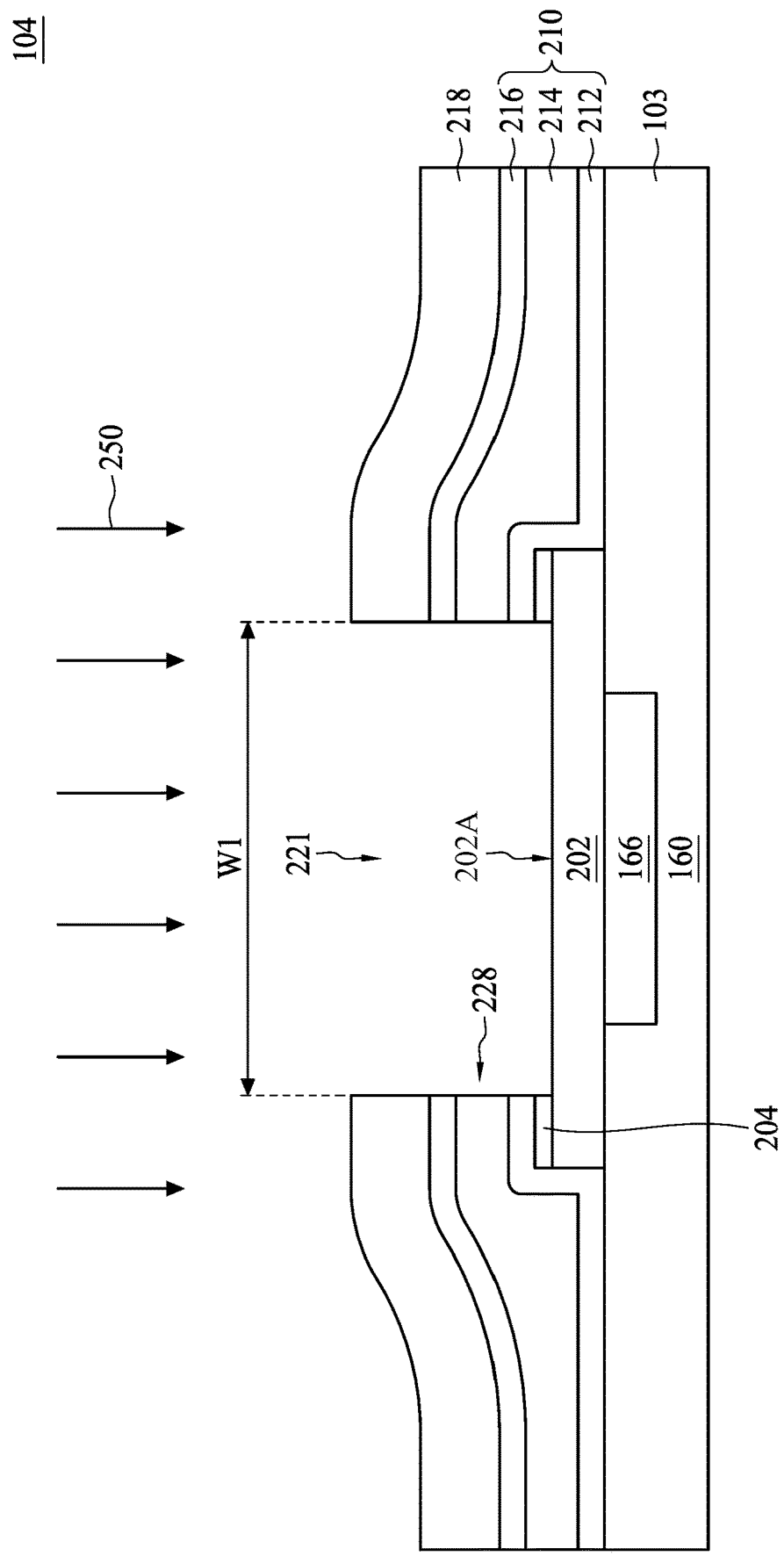

Referring to FIG. 6, an etching operation 250 is performed on the pad structure 104 such that a recess 221 is formed through the first passivation 218, the composite dielectric layer 210 and the protection region 204. The recess 221 may partially expose the upper surface 202A of the conductive pad region 202. In some embodiments, the exposed area of the conductive pad region 202 has a width W1 between about 30 µm and about 100 µm, for example about 50 µm. Sidewalls 228 of the first passivation 218, the composite dielectric layer 210 and the protection region 204 are exposed to the recess 221. In some embodiments, the etching operation 250 may be a dry etch, a wet etch, or a combination thereof. In the depicted embodiment, a dry etch or a reactive ion etching (RIE) operation is adopted in which etching is conducted substantially along a vertical direction perpendicular to the surface 202A of the conductive pad region 202. As a result, the sidewalls 228 defining the resultant recess 221 have a substantially vertical profile.

Although not shown, a photoresist layer may be formed over the first passivation layer 218 to define the geometry of the recess 221. Furthermore, after the recess 221 is formed, the photoresist layer may be cleaned or stripped.

In some embodiments, in order to ensure complete removal of the passivation material from the surface 202A of the conductive pad region 202, the conductive pad region 202 may be over-etched such that a depth of the conductive pad region 202 is removed during the etching operation. In some embodiments, the recessed thickness of the conductive pad region 202 formed by the etching operation 250 is less than about 0.25 µm, for example 0.1 µm.

Figure 7:
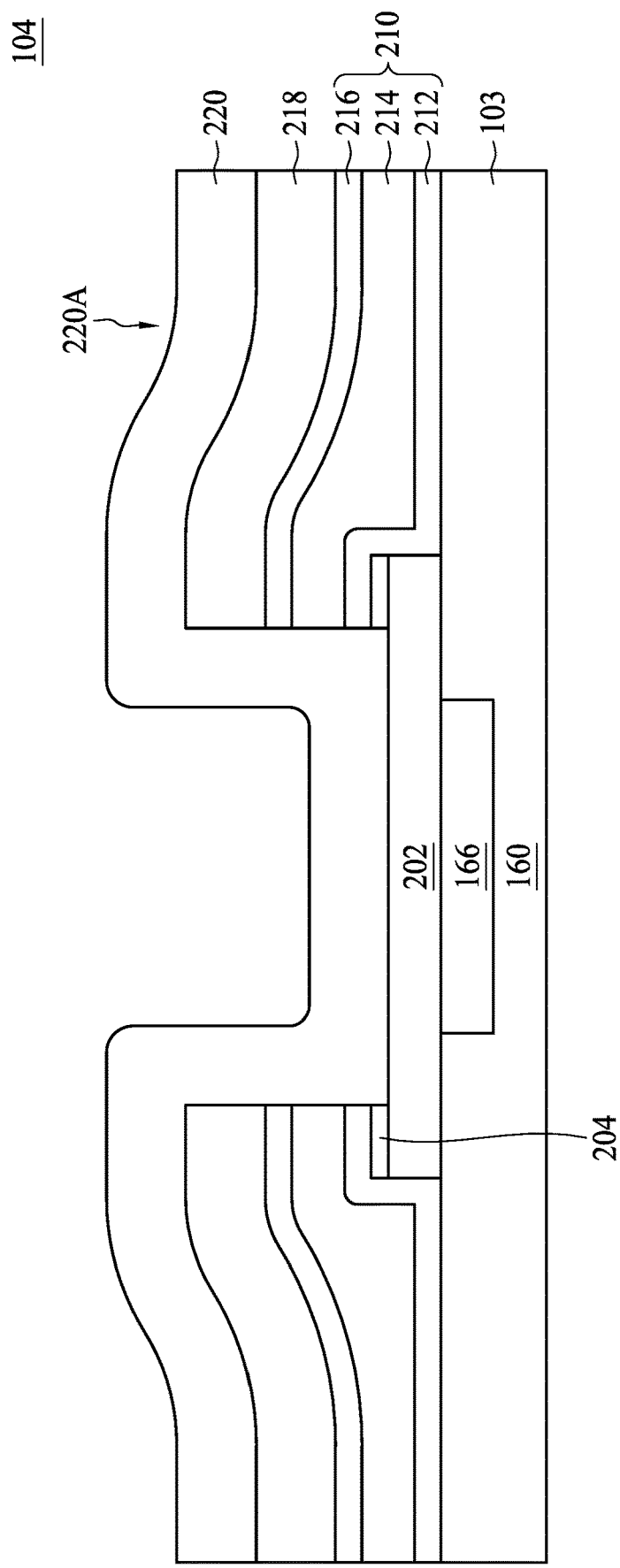

Next, a second passivation layer 220 is conformally formed over the first passivation layer 218 and in the recess 221, as demonstrated in FIG. 7. The second passivation layer 220 is laterally surrounded by the composite dielectric layer 210 and the protection region 204. In some embodiments, the second passivation layer 220 covers sidewalls of the composite dielectric layer 210 (i.e., the oxide layers 212, 214 and 216) and the upper surface 202A that were previously exposed to the recess 221 in FIG. 6. In addition, the second passivation layer 220 covers a sidewall of the first passivation layer 218 that was exposed to the recess 221 by the etching operation 250. In some embodiments, the second passivation layer 220 is formed of a dielectric material, such as a silicon nitride, silicon dioxide, silicon oxynitride or titanium dioxide. In some embodiments, the second passivation layer 220 is formed of a dielectric material different from that of the composite dielectric layer 210 in order to protect the composite dielectric layer 210 from hydrogen and water. In some embodiments, the second passivation layer 220 includes a same material as the first passivation layer 218, such as silicon nitride, and thus these two passivation layers may be deemed as a single passivation layer. In some embodiments, the second passivation layer 220 has a thickness between about 0.8 µm and about 1.8 µm, for example 1.2 µm. In some embodiments, the second passivation layer 220 is formed using CVD, PVD, ALD, or other suitable process.

Figure 8:
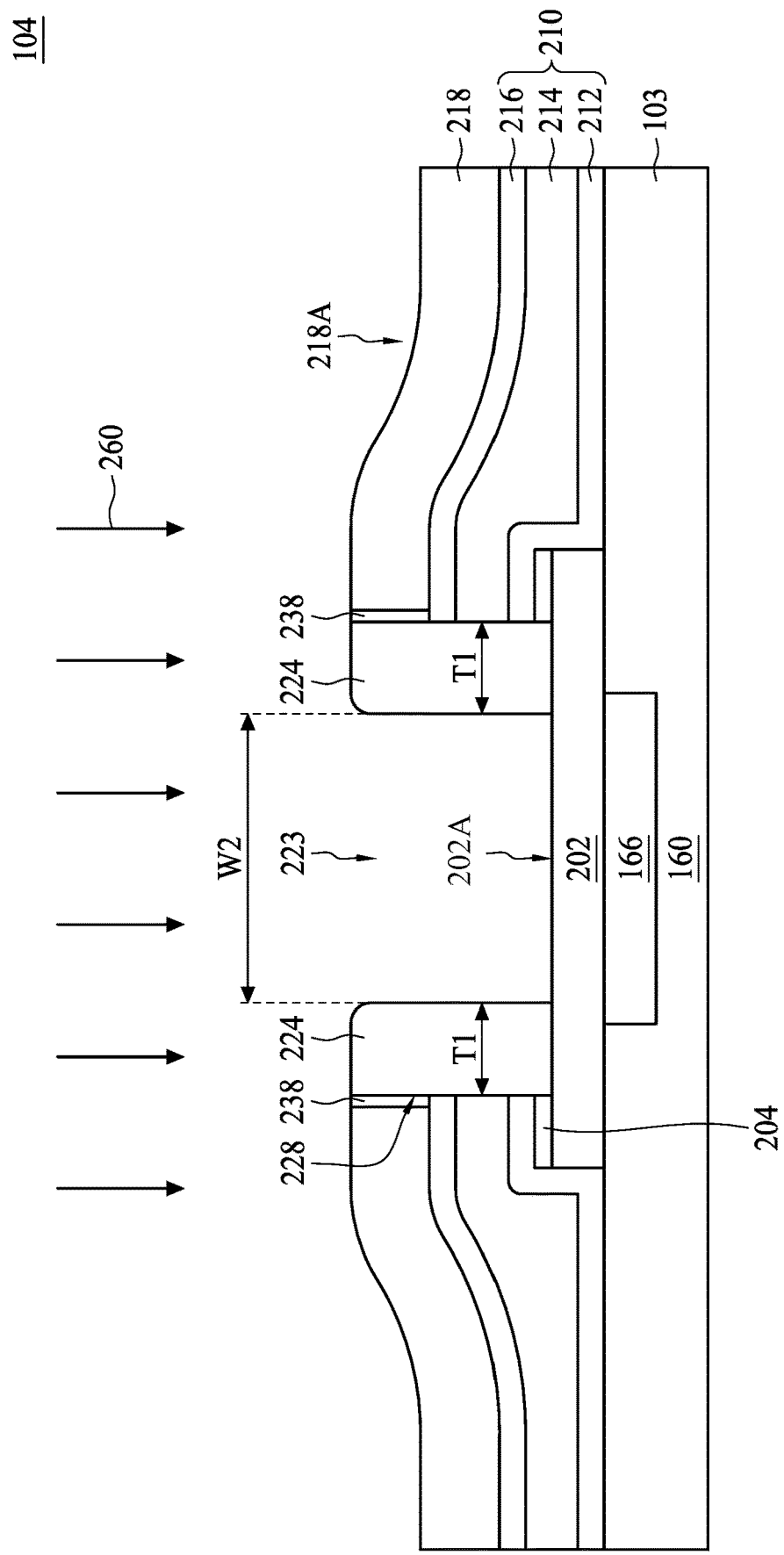

FIG. 8 shows a patterning operation on the second passivation layer 220. An etching operation 260 is performed to etch the second passivation layer 220 such that a recess 223 is formed to partially expose the upper surface 202A of the conductive pad region 202. Horizontal portions of the second passivation layer 220 within the recess 221 are removed, resulting in vertical portions (or sidewalls) of the etched second passivation layer 224 that define the geometry of the recess 223. In some embodiments, the exposed area of the conductive pad region 202 has a width W2 between about 30 µm and about 80 µm, for example about 50 µm. In some embodiments, the area of the conductive pad region 202 exposed in the recess 223 is smaller than the area exposed in the recess 221 due to the sidewall thickness of the etched second passivation layer 224. In some embodiments, the width W2 is less than the width W1. In addition, the sidewalls of the etched second passivation layer 224 cover sidewalls of the first passivation 218, the composite dielectric layer 210 and the protection region 204. In some embodiments, the etched second passivation layer 224 includes a sidewall thickness between about 0.8 µm and about 1.8 µm, for example 1.2 µm. In some embodiments, the etching operation 260 may be a dry etch, a wet etch, or a combination thereof. In the depicted embodiment, a dry etch or an RIE operation is adopted such that the recess 223 is etched along a vertical direction perpendicular to the surface 202A of the conductive pad region 202, resulting in a substantially vertical sidewall profile with a thickness T1 across the sidewalls of the protection region 204 and the composite dielectric layer 210.

In the depicted embodiment, the etching operation 260 is performed in a self-aligned manner. For example, the sidewall of the etched second passivation layer 224 is formed using an anisotropic etching operation 260 without using an additional mask or lithographic operation. As a result, a thickness of the second passivation layer 220 is etched so that most of the horizontal portions are removed and vertical sidewall portions of the etched second passivation layer 224 remains around the sidewall 228. In some embodiments, the self-aligned etching operation 260 performs a blanket etch or unselective etch on the second passivation layer 220 using a dry etching process. The dual purposes of covering the exposed sidewalls of the composite dielectric layer 210 and exposing the conductive pad region 202 are achieved by addition and self-aligned etching of the second passivation layer 220. Thus, only a single lithographic operation is required. In contrast, existing approaches utilize a single passivation layer deposition and two separate lithographic operations to expose the sidewall of the composite dielectric layer, deposit the single passivation layer covering the sidewalls of the composite dielectric layer and the surface of the conductive pad region, and expose the conductive pad region through etching the single passivation layer. Based on the foregoing, it is clear that the proposed method provides a processing advantage in saving at least one lithographic operation. Moreover, the sidewall thickness T1 of the etched second passivation layer 224 using a self-aligned patterning approach is greater than that obtained using the patterning methods for the existing schemes. A better passivation and protection performance of the passivation layer is achieved accordingly.

In some embodiments, the self-aligned etching operation 260 further removes a horizontal portion 220A (See FIG. 7) of the second passivation layer 220 covering the first passivation layer 218. In some embodiments, horizontal portions 218A of the first passivation layer 218 are exposed through the etching operation 260. In some embodiments, a depth of the horizontal portions 218A is etched through the etching operation 260. In some embodiments, the etched second passivation layer 224 has a top portion leveled with the first passivation layer 218.

Figure 9:
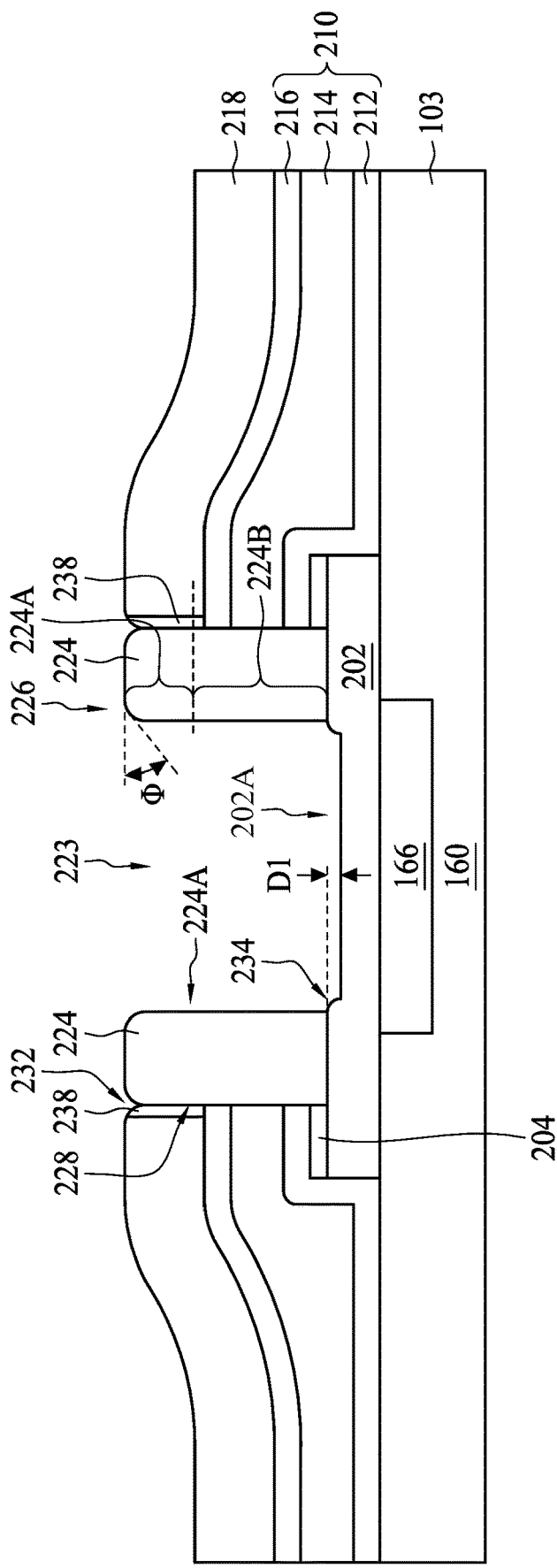

Referring to FIG. 9, the sidewall 228 of the first passivation layer 218 contacting the etched second passivation layer 224 acts an interface between the first passivation layer 218 and the etched second passivation layer 224. In some embodiments, the sidewall 228 is substantially aligned with the sidewalls of the composite dielectric layer 210 and the protection region 204 that contact the etched second passivation layer 224 through the etching operation 250. In some embodiments, a dielectric layer 238, such as silicon oxide, is formed on the vertical-extending sidewall 228 between the etched second passivation layer 224 and the first passivation layer 218. The dielectric layer 238 is a thin film and may be previously formed on the sidewall 228 before the etched second passivation layer 224 is deposited on the first passivation layer 218 (although not separately shown in FIG. 6 or FIG. 7). The dielectric layer 238 may be different from the first passivation layer 218 or the etched second passivation layer 224 and thus forms an observable boundary or interface on the sidewall 228. The dielectric layer 238 may not be present on the sidewalls of the composite dielectric layer 210. In some embodiments, during the etching operation 260, the joint surface across the horizontal portion 218A of the first passivation layer 218 and the second passivation layer 220 may not be kept completely uniform. For example, a dimple 232 is formed on the joint surface around the interface/sidewall 228.

Still referring to FIG. 9, in some embodiments, the etching operation 260 is performed to ensure complete removal of the passivation material from the surface 202A of the conductive pad region 202. In some cases, the conductive pad region 202 may be over-etched such that a depth D1 of the conductive pad region 202 is removed during forming the recess 223 and the surface 202A is a recessed surface. A sidewall 234 of the recessed surface 202A is formed that meets the sidewall of the etched second passivation layer 224. In some embodiments, the recessed height (i.e., the height of the sidewall 234) of the conductive pad region 202 formed by the etching operation 260 is between about 100 Angstrom and about 200 Angstrom.

In some embodiments, the sidewall of the etched second passivation layer 224 comprises an upper portion 224A and a lower portion 224B. In some embodiments, the upper portion 224A has a tapered shape due to the self-aligned etching operation 260. In contrast, the lower portion 224B has a relatively vertical sidewall with a substantially equal thickness. The lower portion 224B may cover sidewalls of the composite dielectric layer 210 and the protection region 204. In some embodiments, the lower portion 224B may partially cover the sidewall of the first passivation layer 218. In some embodiments, while achieving a relatively vertical sidewall profile of the lower portion 224B, the etching operation 260 may form a corner 226 in the upper portion 224A of the etched second passivation layer 224. The corner 226 may be formed as a rounded corner by the etching operation 260. In some other examples, the corner includes an angle $\Phi$ measured between the angled surface of the top portion of the etched second passivation layer 224 and a horizontal plane. In some embodiments, the angle $\Phi$ is between about 40 degrees and about 60 degrees, for example 45 degrees.

Figure 10:
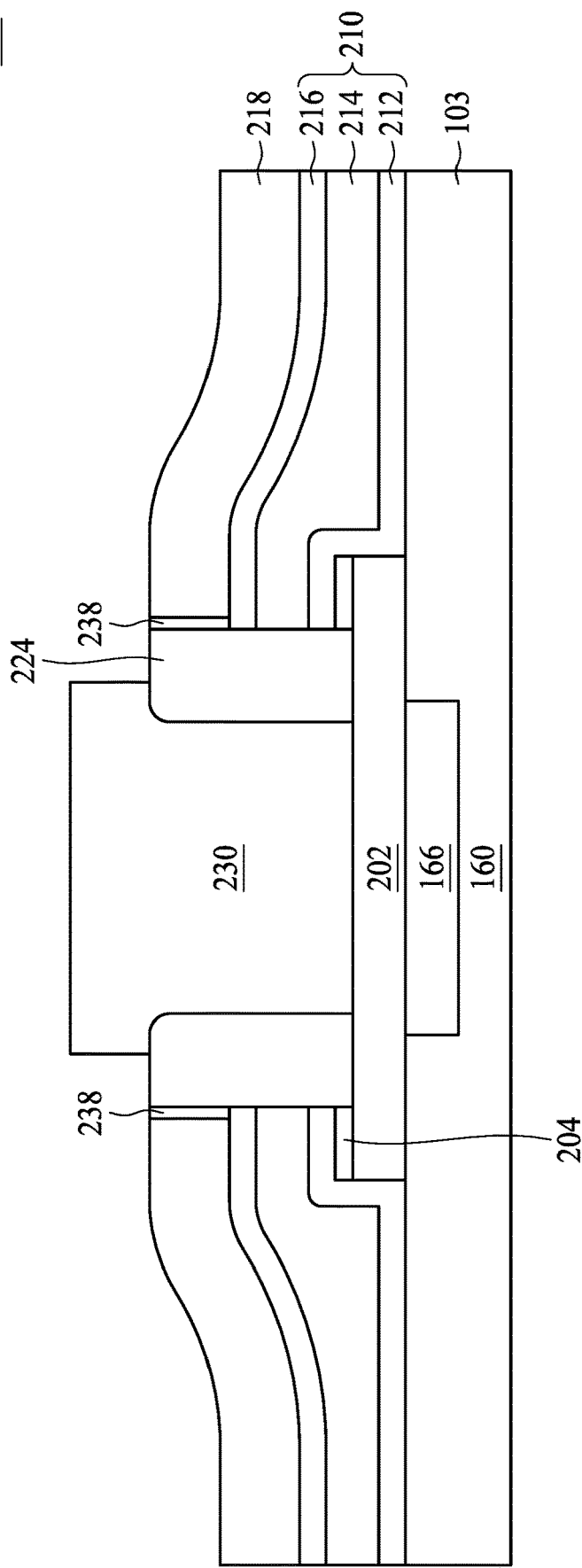

Referring to FIG. 10, a conductive plug 230 is formed in the recess 223. The conductive plug 230 is laterally surrounded by the vertical portion of the etched second passivation layer 224. The conductive plug 230 is formed of a conductive material, such as tungsten, copper, titanium, combinations thereof, or the like. In some embodiments, the conductive plug 230 partially covers the etched second passivation layer 224. The conductive plug 230 may be formed of CVD, PVD, electroplating, or other suitable methods.

In some embodiments, some thermal treatments or cleaning operations are performed during or subsequent to the formation of the second passivation layer 220. Since the exposed sidewalls of the composite dielectric layer 210 are already covered by the second passivation layer 220, the reacting gas that may include hydrogen or water is blocked by the second passivation layer 220 from penetrating into the composite dielectric layer 210 and arriving at the memory cells 122 in the memory layer 102. The structural integrity of the memory cells 122 can be maintained accordingly.

According to an embodiment of the present disclosure, a method of manufacturing a semiconductor device includes: forming a conductive pad region over a substrate; depositing a dielectric layer over the conductive pad region; forming a first passivation layer over the dielectric layer; etching the first passivation layer through the dielectric layer, thereby exposing a first area of the conductive pad region; forming a second passivation layer over the first area of the conductive pad region; and removing portions of the second passivation layer to expose a second area of the conductive pad region.

According to an embodiment of the present disclosure, A method of manufacturing a semiconductor device includes: forming a conductive pad region over a substrate; depositing at least one dielectric layer over the conductive pad region; forming a first passivation layer over the at least one dielectric layer; forming a recess through the first passivation layer and the at least one dielectric layer, the recess exposing an area of the conductive pad region; and forming a second passivation layer over the conductive pad region, the second passivation layer re-exposing the area of the conductive pad region.

According to an embodiment of the present disclosure, a method of forming a semiconductor device includes forming a memory cell over a substrate and forming a redistribution layer over the memory cell. The forming of the redistribution layer includes: forming a pad region at a topmost layer of the redistribution layer; depositing a dielectric layer stack to cover the pad region; depositing a first passivation layer over the dielectric layer stack; forming a recess through the first passivation layer and the dielectric layer stack to thereby expose a first portion of the pad region; depositing a second passivation layer over the recess, the first passivation layer and the first portion; and performing a self-aligned etching on the second passivation layer to expose a second portion of the pad region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a conductive pad region over a substrate;
    depositing a dielectric layer to cover the conductive pad region;
    forming a first passivation layer over the dielectric layer;
    etching the first passivation layer through the dielectric layer, thereby exposing a first area of the conductive pad region;
    forming a second passivation layer over the first area of the conductive pad region; and
    removing portions of the second passivation layer to expose a second area of the conductive pad region,
    wherein the removing of the portions of the second passivation layer comprises etching a portion of the first passivation layer.

2. The method according to claim 1, wherein removing portions of the second passivation layer comprises etching the second passivation layer using a self-aligned scheme.

3. The method according to claim 1, wherein etching the first passivation layer through the dielectric layer comprises exposing a sidewall of the dielectric layer, and wherein forming a second passivation layer over the first area of the conductive pad region comprises forming the second passivation layer covering the sidewall of the dielectric layer.

4. The method according to claim 1, wherein removing portions of the second passivation layer comprises exposing a horizontal portion of the first passivation layer.

5. The method according to claim 1, wherein removing portions of the second passivation layer comprises exposing a horizontal portion of the first passivation layer.

6. The method according to claim 5, wherein removing portions of the second passivation layer comprises forming a dimple at an interface between the first passivation layer and the second passivation layer.

7. The method according to claim 1, wherein removing portions of the second passivation layer comprises forming a rounded corner at a top portion of the second passivation layer.

8. The method according to claim 1, wherein depositing a dielectric layer over the conductive pad region comprises forming a first oxide layer using a plasma-enhanced chemical vapor deposition over the conductive pad region and depositing a high-density plasma oxide over the first oxide layer.

9. The method according to claim 1, wherein removing portions of the second passivation layer comprises recessing a depth of the conductive pad region.

10. The method according to claim 1, further comprising performing a thermal treatment subsequent to forming the second passivation layer.

11. A method of manufacturing a semiconductor device, comprising:
    forming a conductive pad region over a substrate;
    depositing at least one dielectric layer to overlap an entirety of the conductive pad region;
    forming a first passivation layer over the at least one dielectric layer;
    forming a recess through the first passivation layer and the at least one dielectric layer, the recess exposing an area of the conductive pad region; and
    forming a second passivation layer over the conductive pad region, the second passivation layer re-exposing the area of the conductive pad region,
    wherein the forming of the second passivation layer comprises forming a dimple at an interface between the first passivation layer and the second passivation layer.

12. The method according to claim 11, wherein the second passivation layer covers a sidewall of the first passivation layer.

13. The method according to claim 11, further comprising forming a redistribution layer over the substrate, wherein the conductive pad region is formed in a topmost layer of the redistribution layer.

14. The method according to claim 11, further comprising forming a protection region covering the conductive pad region prior to depositing the at least one dielectric layer.

15. The method according to claim 11, further comprising forming a conductive plug over the conductive pad region, the conductive plug laterally surrounded by a sidewall of the second passivation layer.

16. A method of manufacturing a semiconductor device, comprising:
    forming a memory cell over a substrate; and
    forming a redistribution layer over the memory cell, the forming of the redistribution layer comprising;
        forming a pad region at a topmost layer of the redistribution layer;
        depositing a dielectric layer stack to cover the pad region;
        depositing a first passivation layer over the dielectric layer stack;

forming a recess through the first passivation layer and the dielectric layer stack to thereby expose a first portion of the pad region;

depositing a second passivation layer over the recess, the first passivation layer and the first portion; and performing a self-aligned etching on the second passivation layer to expose a second portion of the pad region.

17. The method according to claim 16, wherein the second portion overlaps the first portion.

18. The method according to claim 16, wherein forming a dielectric layer stack to cover the pad region comprising depositing a first oxide layer, a second oxide layer and a third oxide layer over one another, wherein the first oxide layer and the third oxide layer comprise a same material.

19. The method according to claim 16, further comprising forming a protection region to cover a top portion of the pad region while exposing a sidewall of the pad region prior to forming the dielectric layer stack.

20. The method according to claim 16, further comprising forming a conductive plug to electrically couple to the pad region.

* * * * *